United States Patent
Huang et al.

(10) Patent No.: US 7,868,393 B2
(45) Date of Patent: Jan. 11, 2011

(54) SPACE EFFICIENT INTEGRATED CIRCUIT WITH PASSIVE DEVICES

(75) Inventors: Jenn Hwa Huang, Chandler, AZ (US); Elizabeth C. Glass, Oak Ridge, NC (US)

(73) Assignee: Freescale Semiconductor, Inc., Austin, TX (US)

( * ) Notice: Subject to any disclaimer, the term of this patent is extended or adjusted under 35 U.S.C. 154(b) by 528 days.

(21) Appl. No.: 12/037,280

(22) Filed: Feb. 26, 2008

(65) Prior Publication Data

US 2009/0212374 A1   Aug. 27, 2009

(51) Int. Cl.
   *H01L 27/06* (2006.01)
(52) U.S. Cl. .................. 257/379; 257/528; 257/531; 257/532; 257/E27.016
(58) Field of Classification Search ......... 257/528–543, 257/379
   See application file for complete search history.

(56) References Cited

U.S. PATENT DOCUMENTS

| | | | |
|---|---|---|---|
| 6,201,287 B1 * | 3/2001 | Forbes | ........................ 257/528 |
| 6,906,406 B2 | 6/2005 | Hwang et al. | |
| 7,132,747 B2 | 11/2006 | Kwon et al. | |
| 7,176,579 B2 | 2/2007 | Konishi et al. | |
| 7,230,316 B2 * | 6/2007 | Yamazaki et al. | ........... 257/531 |

* cited by examiner

*Primary Examiner*—Steven Loke
*Assistant Examiner*—Jonathan Han
(74) *Attorney, Agent, or Firm*—Ingrassia Fisher & Lorenz, P.C.

(57) ABSTRACT

A multimodal integrated circuit (IC) is provided, comprising, first (74) and second (76) semiconductor (SC) devices, and first (78) and second (80) integrated passive devices (IPDs) coupled, respectively, to the first (74) and second (76) SC devices, wherein the first IPD (78) overlies the second SC device (76) and the second IPD (80) overlies the first SC device (74) chosen such that the underlying SC device (74, 76) is not active at the same time as its overlying IPD (80, 78). By placing the IPDs (78, 80) over the SC devices (76, 74) a compact IC layout is obtained. Since the overlying IPD (78, 80) and underlying SC (76, 74) are not active at the same time, undesirable cross-talk (68, 69) between the IPDs (78, 80) and the SC devices (76, 74) is avoided. This arrangement applies to any IC having multiple signal paths (RF1, RF2) where the IPDs (78, 80) of a first path (RF1, RF2) may be placed over the SC devices (76, 74) of a second path (RF2, RF1) not active at the same time. This is especially useful with high frequencies ICs.

20 Claims, 3 Drawing Sheets

SPACE EFFICIENT INTEGRATED CIRCUIT WITH PASSIVE DEVICES

FIELD OF THE INVENTION

The present invention generally relates to integrated circuits (ICs) and, more particularly, to ICs that incorporate integrated passive devices (IPDs).

BACKGROUND OF THE INVENTION

There is an ongoing need to reduce the chip size of integrated circuits (ICs). Among other things, this is because the cost of manufacture is generally dependent on the chip area, the larger the chip area, the higher the cost. A further consideration is the very small size of modern electronic apparatus, especially portable electronic devices implemented using ICs. Often, such ICs must not only have minimum area but also minimum thickness in order to fit within the very thin cases desired for such portable electronic devices. Thus, minimizing both IC thickness and IC area are important goals.

Many applications of ICs require that passive components (e.g., resistors, capacitors, inductors, filters, transmission lines interconnects, and combinations thereof, etc.) be included within the ICs as well as active components such as transistors and diodes of various kinds. In some cases the passive components (e.g., diffused resistors, etc.) can be built using semiconductor material of the IC itself and in other cases it is necessary to build such passive devices (e.g., capacitors, resistors, inductors, filters, transmission lines, interconnects, and combinations thereof, etc.) on or above the surface of the semiconductor in which the IC is formed. When built in or on the same semiconductor substrate in which the IC is formed, these passive devices are referred to as "integrated passive devices," abbreviated as "IPDs". In these circumstances the passive devices are an integral part of the IC chip and are generally formed on the IC while it is still in wafer form and before being singulated (i.e., cut from the wafer into individual ICs). Thus, the IPDs are already present on the IC when the IC chip is, for example, mounted on a module, motherboard or tape and combined with other devices and components. In some applications, especially high frequency and/or high power circuits, these IPDs can become large compared to the semiconductor devices of the IC and may become a significant or dominant factor in determining the size (i.e., area and thickness) and functionality of the IC chip. Accordingly, there is an ongoing need for improved techniques for providing space efficient ICs, especially ICs incorporating integrated passive devices (IPDs). Also, it is desirable that the improved IC's containing such IPDs be compatible with existing IC manufacturing techniques. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
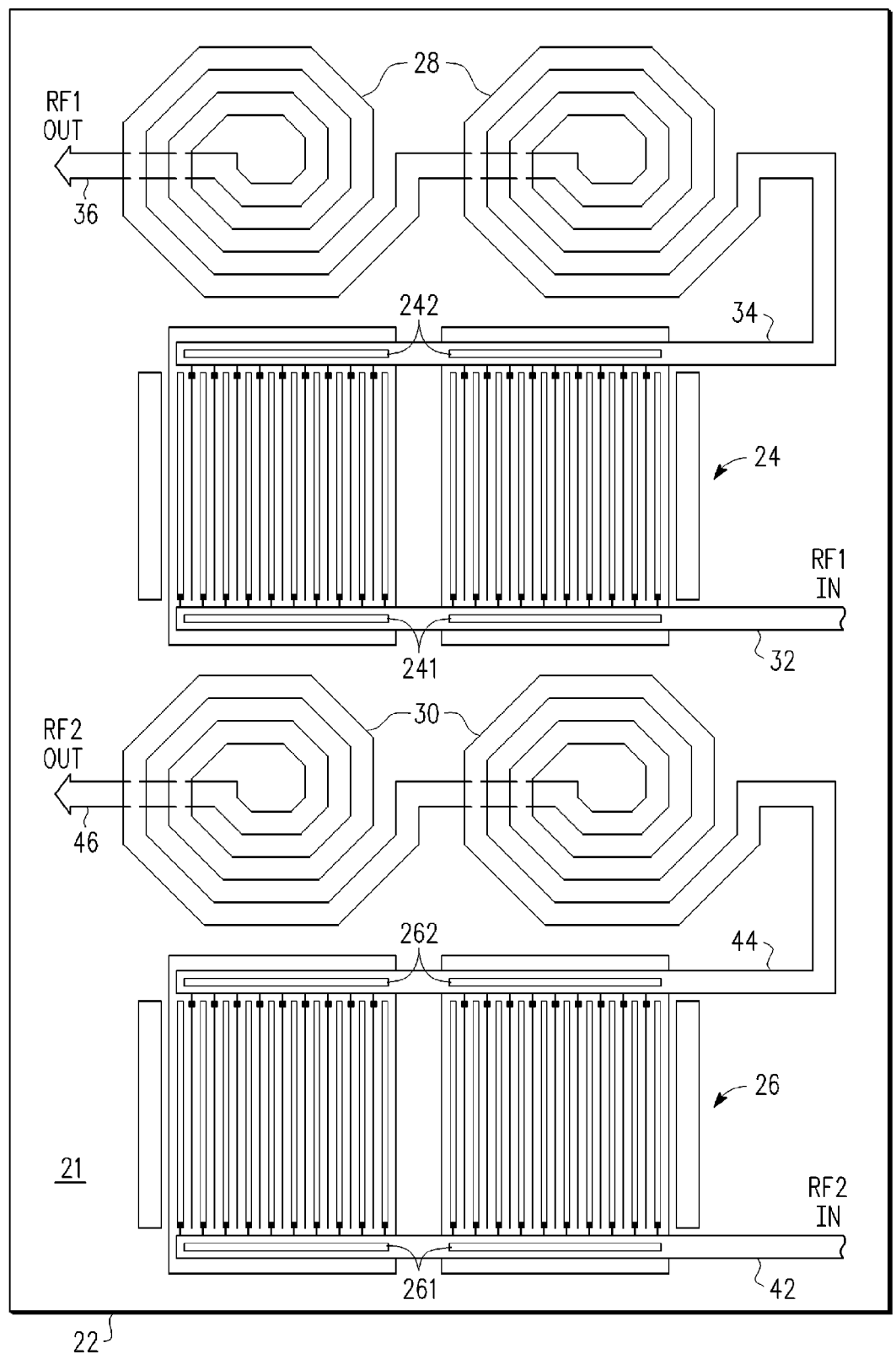
FIG. 1 is a simplified schematic drawing of a plan view of a portion of an integrated circuit (IC) incorporating two semiconductor (SC) devices and two integrated passive devices (IPDs) in side-by-side configuration.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

FIG. 1 is a simplified schematic drawing of plan view 20 of portion 22 of a radio frequency (RF) integrated circuit (IC) incorporating two semiconductor (SC) devices 24, 26 (e.g., amplifiers or switches) and two IPDs (e.g., planar inductors 28, 30) in conventional side-by-side configuration. For convenience of explanation, it is assumed that transistors 24, 26 are field effect transistors (FETs) having source contacts 241, 261 and drain contacts 242, 262 respectively, and that integrated passive devices (IPDs) 26, 28 are planar inductors, but these are merely intended as examples and not essential choices. SC devices 24, 26 of FIGS. 1-2 (as well as 74, 76 of FIG. 4) are each shown as being divided into two parts but that is not essential). Details of the control (e.g., gate) contacts of SC devices 24, 26 are omitted in FIG. 1 (and FIGS. 2 and 4) to avoid unduly cluttering the figures and obscuring the invention. Persons of skill in the art will understand that such control (e.g., gate) contacts are part of SC devices 24, 26. Other than the fact that they are present and used in controlling SC devices 24, 26, the particular manner in which the control signals are provided to SC devices 24, 26 is not essential to the present invention. Other types of IPDs and SC devices may also be used. Persons of skill in the art will understand based on the description herein that the transistors and inductors described herein are merely illustrative and not intended to be limiting and that any desired type of SC devices and substantially planar passive devices may be used. Resistors, capacitors, inductors, filters, transmission lines, interconnects and combinations of these elements are non-limiting examples of other suitable kinds of IPDs. The filters can include surface acoustic type resonators and/or micro-electrical-mechanical systems (MEMS). Accordingly, the words "integrated passive devices" and the abbreviation "IPD" are intended to include such variations. For convenience of description and not intended to be limiting, SC devices 24, 26 and IPDs 28, are shown, respectively, as being series coupled but other coupling arrangements are also useful.

Figure 2:
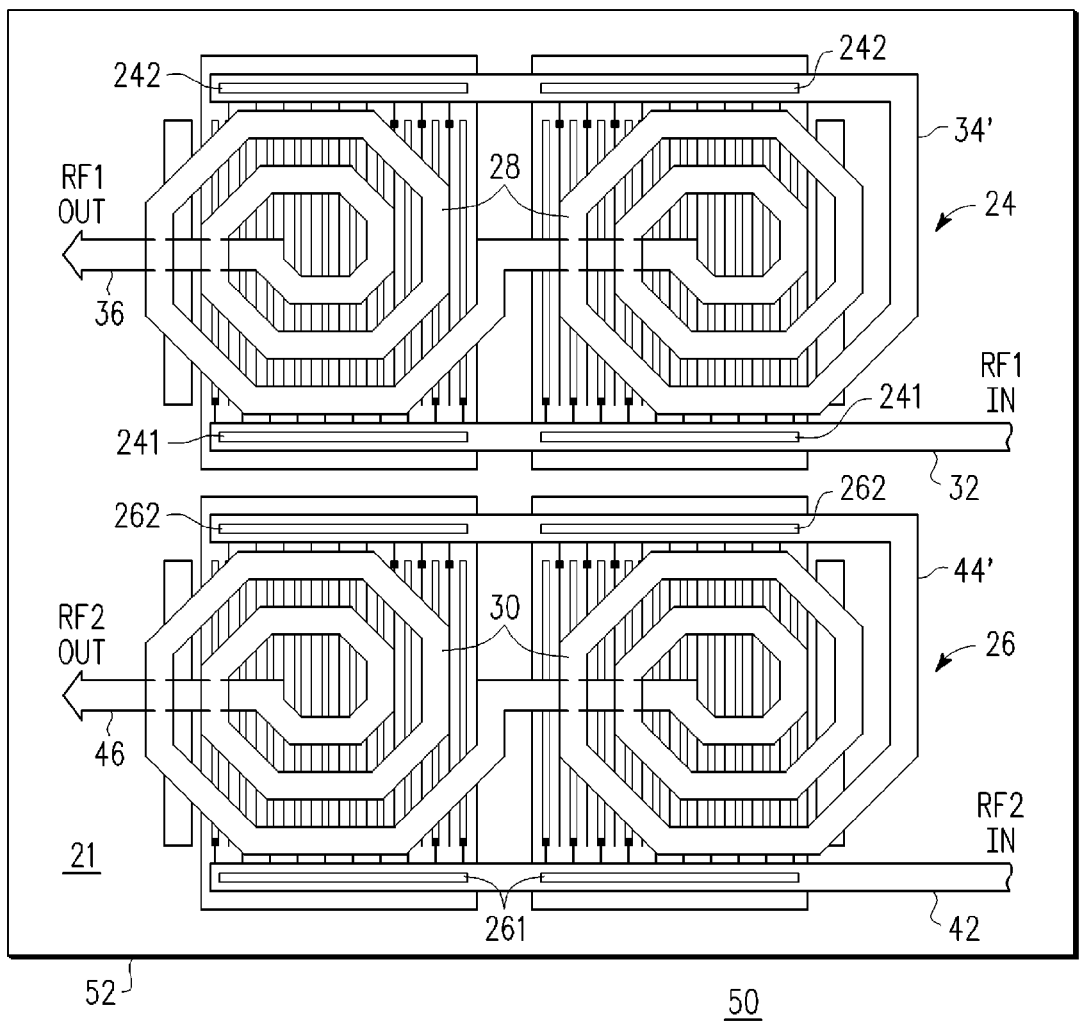
FIG. 2 is a simplified schematic drawing of a plan view analogous to FIG. 1, of a portion of an integrated circuit (IC) incorporating two semiconductor devices and two IPDs in a stacked configuration wherein the IPDs overlie the SC devices so as to reduce the total occupied area of the IC.

It is assumed in connection with FIG. 1 (and with FIGS. 2 and 4) that two radio frequency (RF) paths are being provided in this integrated circuit (IC) comprising SC devices 24, 26 and IPDs 28, 30. These two paths are identified by the designations RF1 and RF2. A first RF signal (e.g., RF1) is applied to input (RF1 IN) 32, passes through SC device 24 and is coupled to IPD 28 via lead 34 from whence it passes through IPD 28 to output (RF1 OUT) 36. A second RF signal (e.g., RF2) is applied to input (RF2 IN) 42, passes through SC device 26 and is coupled to IPD 30 via lead 44 from whence it passes through IPD 30 to output (RF2 OUT) 46. In the arrangement of FIG. 1, SC devices 24, 26 and IPDs 28, 30 are laid out in a side-by-side configuration. A dielectric layer (not shown) underlying IPDs 28, 30 insulates IPDs 28, 30 from underlying SC substrate 21. Inductors 28, 30 are desirably of highly conductive metal, but other conductive materials may also be used. Devices 24, 26 and IPDs 28, 30 are fabricated using conventional planar processing technology using techniques well known in the art. The arrangement of FIG. 1 can provide satisfactory electrical performance since SC devices 24, 26 and IPDs 28, 30 can be well isolated so as to avoid cross-talk. However, the side-by-side arrangement of FIG. 1 requires a relatively large amount of chip area, and is therefore not space efficient. A more space-efficient arrangement is shown in FIG. 2. As used herein, the words "cross-talk" refer to unintended electrical coupling, especially at high frequencies, between different IC elements, usually to the detriment of overall IC performance.

FIG. 2 is a simplified schematic drawing of plan view 50 analogous to FIG. 1, of portion 52 of an integrated circuit (IC) incorporating SC devices (e.g., FETs) 24, 26 and IPDs (e.g., planar inductors) 28, 30 in a stacked configuration, wherein IPDs 28, 30 overlie SC devices 24, 26 so as to reduce the total occupied area. The same reference numbers are used to identify elements analogous to those of FIG. 1. An insulating layer is provided between SC devices 24, 26 and IPDs 28, 30 to provide electrical isolation (see layer 642 between control electrodes 66 of device 62 and IPD conductors 65 of FIG. 3). Other than mask changes and perhaps an additional dielectric layer, IPDs 28, 30 and SC 24, 26 are fabricated by generally the same technologies used for the devices of FIG. 1. A first RF signal (e.g., RF1) is applied to input (RF1 IN) 32, passes through SC device 24 and is coupled to IPD 28 via lead 34' from whence it passes through IPD 28 to output (RF1 OUT) 36. A second RF signal (e.g., RF2) is applied to input (RF2 IN) 42, passes through SC device 26 and is coupled to IPD 30 via lead 44' from whence it passes through IPD 30 to output (RF2 OUT) 46. While the arrangement of FIG. 2 works well at lower frequencies, as the operating frequency increases, especially into the range of 700 to 10,000 megahertz and beyond, the overall performance degrades because of undesired cross-talk between devices 24, 26 and IPDs 28, 30, that is, SC device 24 and IPD 28 interact unfavorably and SC device 26 and IPD 30 interact unfavorably. This cross-talk is illustrated schematically in FIG. 3.

Figure 3:
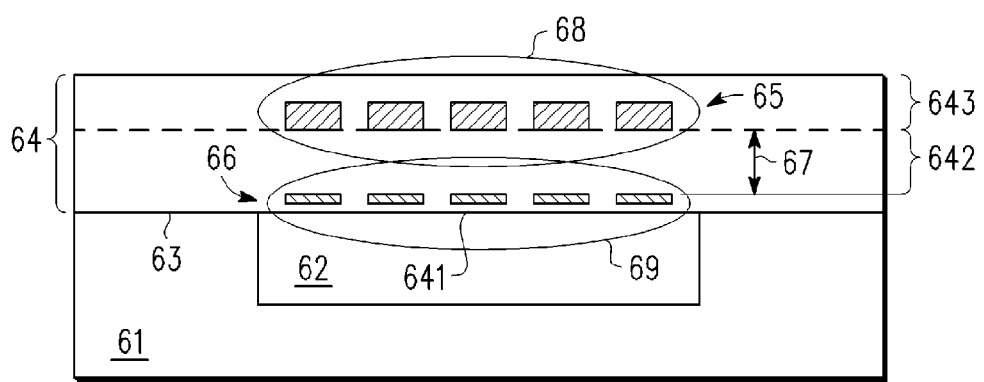
FIG. 3 is a generalized schematic cross-sectional drawing of an IPD (e.g., an inductor) overlying a semiconductor (SC) device (e.g., a FET) illustrating how the electro-magnetic fields of the IPD and SC device can cause mutual interference, i.e., "cross-talk" therebetween.

FIG. 3 shows generalized schematic cross-sectional drawing 60 of SC substrate 61 having therein SC device 62 analogous to SC devices 24, 26 with upper surface 63 overlaid by dielectric 64 is which are embedded planar conductors 65 as would be required, for example, for an IPD in the form of a planar inductor analogous to IPDs 28, 30. It is assumed in this illustration that SC device 62 is an insulated gate field effect transistor (IGFET) or Schottky gate field effect transistor (SGFET), with control electrodes (e.g., gates) 66 overlying gate dielectric 641 and separated by thickness 67 of interlayer dielectric 642 from IPD conductors 65. As used herein, the term "field effect transistor" and the abbreviation "FET" are intended to include both IGFETs and SGFETs. Conductors 65 may in turn be covered by dielectric passivation layer 643. Dielectric 641 underlying control (e.g., gate) electrodes 66 is typically formed from a refractory oxide, interlayer dielectric 642 is typically of silicon nitride, silicon oxide or a polyimide, and dielectric passivation layer 643 is typically also of silicon nitride, silicon oxide or a polyimide, but other dielectrics may also be used. Control electrodes 66 are typically metal or doped semiconductor or polysilicon or combinations thereof, and IPD conductors 65 are typically highly conductive metals. Such dielectric and conductive materials and techniques for forming such materials are well known in the art. Ellipses 68, 69 schematically represent the electro-magnetic fields generated by IPD conductors 65 and control electrodes 66. As the operating frequency increases, especially into the range of about 1E9 Hertz and above, the cross-talk between IPD conductors 65 (analogous to IPDs 28, 30) and SC device 62 (analogous to SC devices 24, 26) increases, generally to the detriment of overall IC performance, even though interlayer dielectric 642 between IPD conductors 65 and control electrodes 66 of SC device 62 provides DC isolation therebetween. Stated another way, a certain capacitance will exist between IPD conductors 65 and control electrodes 66 through interlayer dielectric 642 and the impedance of this capacitive and/or inductive coupling can decrease as frequency increases, thus increasing the cross-talk between IPD conductors 66 and control electrodes 66 of SC device 62. Thus, the stacked arrangement of FIG. 2, while useful at lower frequencies, can degrade in performance as the operating frequency increases. Since it is desired to be able to use higher and higher frequencies, it is important to find ways to minimize or avoid this cross-talk without sacrificing the area efficiency of such a stacked arrangement. While the cross-talk can be decreased by increasing the thickness of interlayer dielectric 642 or by inserting a metallic shielding layer between conductors 65 and control electrodes 66, this makes manufacturing more difficult and/or adds extra processing steps, thereby raising the unit cost. It also increases the overall thickness of the IC. These consequences are generally not desirable.

Figure 4:
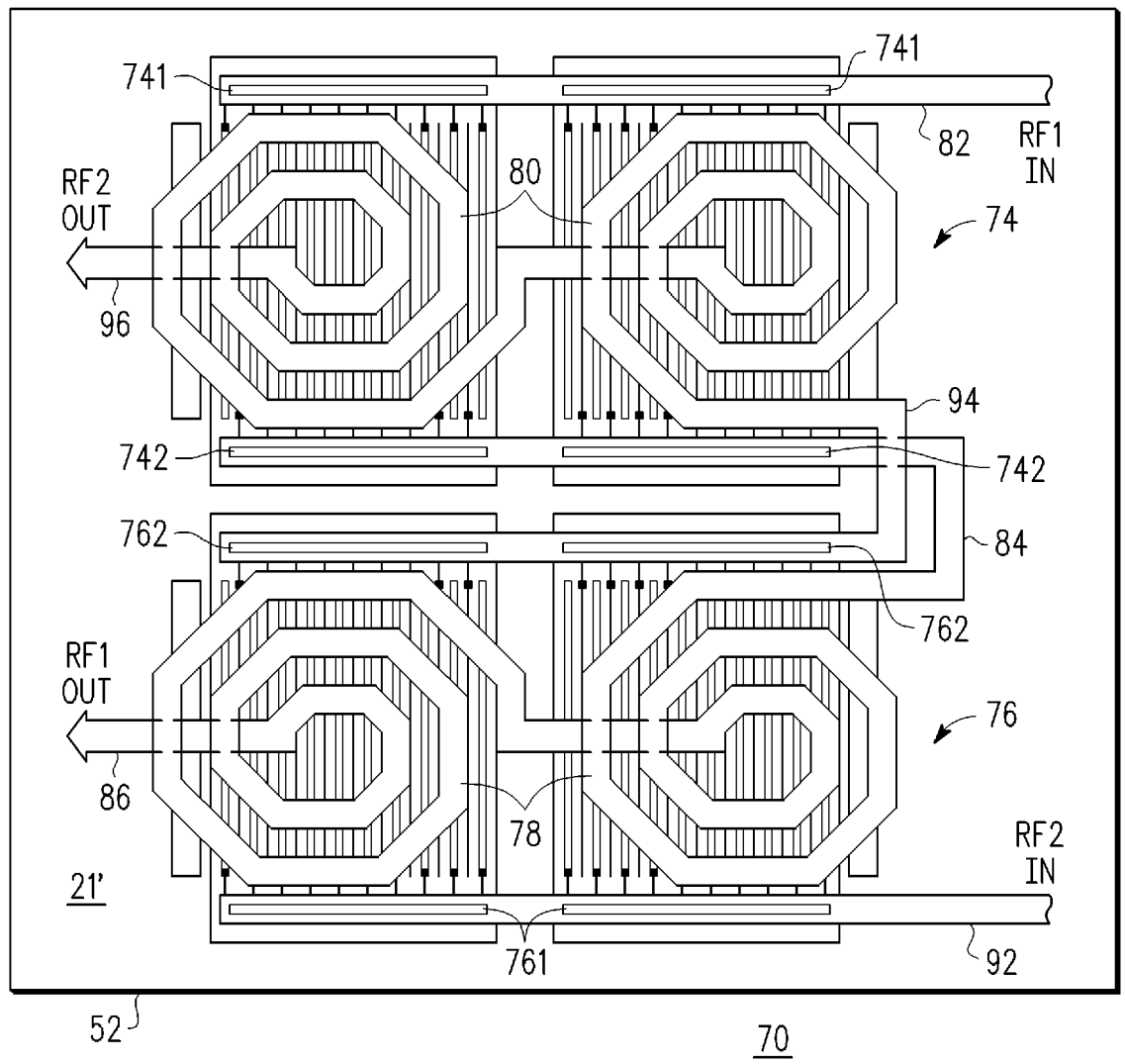
FIG. 4 is a simplified schematic drawing of a plan view of the IPDs and SC devices of FIG. 2, but connected according to an embodiment of the present invention wherein the cross-talk illustrated in FIG. 3 is avoided and the total occupied area reduction of the stacked configuration is preserved.

FIG. 4 is a simplified schematic drawing of plan view 70 of IPDs 78, 80 (e.g., planar inductors) analogous to IPDs 28, 30, and SC devices 74, 76 analogs to SC devices 24, 26 of FIG. 2, but connected according to an embodiment of the present invention wherein the cross-talk illustrated in FIG. 3 is avoided and the total occupied area reduction of the stacked configuration is preserved. Reference should be made to both FIGS. 3 and 4 for the following discussion. In a preferred embodiment, SC devices 62, 74, 76 are formed in semiconductor substrate 21', 61 using conventional technology. Substrate 21', 61 may be a single crystal SC wafer or may be a SC formed on a dielectric substrate, as for example, using semiconductor-on-insulator (SOI) technology or other variations including polycrystalline semiconductors. An interlayer dielectric, e.g., dielectric 642 of FIG. 3, is formed over SC devices 61, 74, 76, and IPDs 65, 78, 80 formed thereon. IPDs 65, 78, 80 may be any type of passive device conveniently manufactured by planar technology, as for example and not intended to be limited, inductances, capacitances, resistances, filters, transmission lines, interconnects and combinations thereof. All such passive devices employ conductive leads or contacts that, other than perhaps their planar layout configuration, are analogous or equivalent to IPD conductors 65 of FIG. 3. Passive elements formed by using various thin film technologies well known in the art are examples of useful passive devices. Non-limiting examples of such thin film technologies are evaporation, sputtering, chemical vapor deposition, molecular beam deposition, and variations and combinations thereof, or by the micro-electrical-mechanical system (MEMS) manufacturing techniques, and apply to both conductors and dielectrics or other insulators. As used herein, the word "monolithic" is intended to include all such implementations in reference to the IC and/or the various layers added to substrate 21', 61.

As before, it is assumed that there are two RF paths identified as RF1 and RF2. What makes the arrangement of FIG. 4 possible is that many applications are multimodal, that is, that pathways RF1 and RF2 are not both ON at the same time. For example and not intended to be limiting, it is often desired to provide the capability to communicate at different frequencies or using signaling protocols, each frequency or protocol being handled by a separate RF pathway. It is assumed hereafter that the IC described herein embodying pathways RF1 and RF2 is multimodal, that is, that pathway RF1 and pathway RF2 are not simultaneously active. SC device 74 (e.g., a FET) analogous to SC device 24 has source 741 and drain 742 and SC device 76 (e.g., a FET) analogous to SC device 26 has source 761 and drain 762. The control gates analogous to gates 66 of FIG. 3 are assumed to be present but not shown in FIG. 4 to avoid unduly cluttering the drawing. Other than their connections, IPDs 78, 80 are analogous to IPDs 28, 30 of FIG. 2. A first RF signal (e.g., RF1) is applied to input (RF1 IN) 82 and is coupled to source 741 of SC device 74. When device 74 is ON, signal RF 1 emerges from drain 742 of SC device 74 and is coupled to IPD 78 overlying SC device 76 via lead 84 from whence it passes through IPD 78 to output (RF1 OUT) 86. A second RF signal (e.g., RF2) is applied at a different time than RF1 to input (RF2 IN) 92 and is coupled to source 761 of SC device 76. When device 76 is ON, signal RF2 emerges from drain 762 of SC device 76 and is coupled to IPD 80 overlying SC device 74 via lead 94 from whence it passes through IPD 80 to output (RF2 OUT) 96. While the inherent capacitive or inductive coupling between IPD 78 and underlying SC device 76 may be unchanged from the situation depicted in FIGS. 2-3, it has no adverse affect on the IC performance since, by design, SC device 76 is not ON when signal RF1 is passing through IPD 78 overlying SC device 76.

Similarly, with signal RF2, wherein SC device 74 is not ON when signal RF2 is passing through IPD 80 overlying SC device 74. Thus, the adverse effects of the cross-talk inherent in the stacked structure of FIGS. 2-3 are avoided and the overall performance of the IC is improved without loss of the area efficiency provided by the stacked arrangement whereby the IPDs are placed above the underlying SC devices as the IC is manufactured. Persons of skill in the art will understand based on the description herein that the invented stacking arrangement illustrated in FIG. 4 applies to any multimodal IC irrespective of the exact nature of the SC devices and the IPDs used in the IC. Stated another way, the present invention applies to any IC that can have SC devices underlying IPDs wherein the underlying SC device is not active at the same time as the overlying IPD or vice versa. As used herein, the word "active" means participating in a signal propagation path. Thus, the SC devices would be active when in an ON state and inactive when in an OFF state. Analogously, the IPDs would be active when carrying a signal and inactive when not carrying a signal.

In a first embodiment, there is provided a multimodal integrated circuit (IC), comprising, first (74) and second (76) semiconductor (SC) devices, first (78) and second (80) integrated passive devices (IPDs), wherein the first IPD (78) is coupled to the first SC device (74) and the second IPD (80) is coupled to the second SC device (76), and wherein the first IPD (78) overlies the second SC device (76) and the second IPD (80) overlies the first SC device (74) and each underlying SC device (74, 76) is not active at the same time as the overlying IPD (80, 78). In a further embodiment, the IPDs (78, 80) comprise a thin film inductor or thin film capacitor or thin film resistor or a combination thereof. In a still further embodiment, the IPDs (78, 80) comprise a filter or transmission line or interconnections or combinations thereof. In a yet further embodiment, the IPDs (78, 80) comprise a filter having therein an acoustic resonator or micro-electrical-mechanical system resonator or a combination thereof. In a still yet further embodiment, the first IPD (78) is serially coupled to the first SC device (74). In a yet still further embodiment, the first IPD (78) is serially coupled to the first SC device (74) and the second IPD (80) is serially coupled to the second SC device (76). In another embodiment, the first (78) and second (80) IPDs are separated from the second (76) and first (74) SC devices by an interlayer dielectric (642). In a yet another embodiment, the SC devices (74, 76) are FETs.

According to a second embodiment, there is provided a monolithic IC, comprising, a substrate (21', 61) having therein first (74) and second (76) semiconductor (SC) devices, each with first (741, 761) and second (742, 762) principal electrodes and a control electrode (66), an interlayer dielectric (642) overlying the first (74) and second (76) SC devices, first (78) and second (80) integrated passive devices (IPDs) overlying the interlayer dielectric (642), and wherein the first IPD (78) overlies the second SC device (76) and the second IPD (80) overlies the first SC device (74), configured so that the first (74) and second (76) SC devices are not ON at the same time that their overlying IPD (80, 78) is active. In a further embodiment, the first IPD (78) is coupled to a principal electrode (742) of the first SC device (74) and the second IPD (80) is coupled to a principal electrode (762) of the second SC device (76). In a still further embodiment, the first IPD (78) is serially coupled to the first SC device (74) and the second IPD (80) is serially coupled to the second SC device (76). In a yet further embodiment, the IPDs (78, 80) comprise planar inductances, planar capacitances or planar resistances or a combination thereof. In a still yet further embodiment, the IPDs (78, 80) comprise a planar filter, transmission line or interconnections or a combination thereof. In a yet still further embodiment, the IPDs (78, 80) comprise a filter having therein an acoustic resonator or a micro-electrical-mechanical system resonator or a combination thereof. In another embodiment, SC devices (74, 76) are field effect transistors with control gates (66) and the IPDs (65, 80, 78) overlie the control gates (66).

According to a third embodiment, there is provided an electronic structure, comprising, a substrate (61, 21'), multiple semiconductor (SC) devices (62, 74, 76) formed in or on the substrate (61, 21'), multiple integrated passive devices (IPDs) (65, 78, 80) formed on the substrate (61, 21'), overlying at least some of the multiple SC devices (62, 74, 76), arranged so that, when the electronic structure is energized, an overlying IPD (65, 78, 80) and its underlying SC device (62, 76, 74) are not active at the same time. In a further embodiment, the electronic structure further comprises an interlayer dielectric (642) located between the overlying IPDs (65, 78, 80) and underlying SC devices (62, 76, 74). According to a still further embodiment, the IPDs (65, 78, 80) comprise planar inductors. According to a yet further embodiment, the SC devices (62, 74, 76) comprise field effect devices. According to a yet still further embodiment, an IPD (80) overlying a first SC device (74) is electrically coupled to a second SC device (76) different than the first SC device (74).

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A multimodal integrated circuit, comprising:
   first and second semiconductor devices;
   first and second integrated passive devices, wherein the first integrated passive device is coupled to the first semiconductor device and the second integrated passive device is coupled to the second semiconductor device; and
   wherein the first integrated passive device overlies the second semiconductor device and the second integrated passive device overlies the first semiconductor device and each underlying semiconductor device is not active at the same time as the overlying integrated passive device.

2. The integrated circuit of claim 1, wherein the integrated passive devices comprise a thin film inductor or thin film capacitor or thin film resistor or a combination thereof.

3. The integrated circuit of claim 1, wherein the integrated passive devices comprise a filter or transmission line or interconnections or combinations thereof.

4. The integrated circuit of claim 3, wherein the integrated passive devices comprise a filter having therein an acoustic resonator or micro-electrical-mechanical system resonator or a combination thereof.

5. The integrated circuit of claim 1, where in the first integrated passive device is serially coupled to the first semiconductor device.

6. The integrated circuit of claim 1, where in the first integrated passive device is serially coupled to the first semiconductor device (74) and the second integrated passive device is serially coupled to the second semiconductor device.

7. The integrated circuit of claim 1, wherein the first and second integrated passive devices are separated from the second and first semiconductor devices by an interlayer dielectric.

8. The integrated circuit of claim 1, where in the semiconductor devices are field effect transistors.

9. A monolithic integrated circuit, comprising:
   a substrate having therein first and second semiconductor devices, each with first and second principal electrodes and a control electrode;
   an interlayer dielectric overlying the first and second semiconductor devices; first and second integrated passive devices overlying the interlayer dielectric; and
   wherein the first integrated passive device overlies the second semiconductor device and the second integrated passive device overlies the first semiconductor device, configured so that the first and second semiconductor devices are not ON at the same time that their overlying integrated passive device is active.

10. The integrated circuit of claim 9, wherein the first integrated passive device is coupled to a principal electrode of the first semiconductor device and the second integrated passive device is coupled to a principal electrode of the second semiconductor device.

11. The integrated circuit of claim 9, wherein the first integrated passive device is serially coupled to the first semiconductor device and the second integrated passive device is serially coupled to the second semiconductor device.

12. The integrated circuit of claim 9, wherein the integrated passive devices comprise planar inductances, planar capacitances or planar resistances or a combination thereof.

13. The integrated circuit of claim 9, wherein the integrated passive devices comprise a planar filter, transmission line or interconnections or a combination thereof.

14. The integrated circuit of claim 13, wherein the integrated passive devices comprise a filter having therein an acoustic resonator or a micro-electrical-mechanical system resonator or a combination thereof.

15. The integrated circuit of claim 9, wherein semiconductor devices are field effect transistors with control gates and the integrated passive devices overlie the control gates (66).

16. An electronic structure, comprising:
   a substrate; multiple semiconductor devices formed in or on the substrate; and
   multiple integrated passive devices formed on the substrate, overlying at least some of the multiple semiconductor devices; arranged so that, when the electronic structure is energized, an overlying integrated passive device and its underlying semiconductor device are not active at the same time.

17. The electronic structure of claim 16, further comprising an interlayer dielectric located between the overlying integrated passive devices and underlying semiconductor devices.

18. The electronic structure of claim 16, wherein the integrated passive devices comprise planar inductors.

19. The electronic structure of claim 16, wherein the semiconductor devices comprise field effect devices.

20. The electronic structure of claim 16, wherein an integrated passive device overlying a first SC device is electrically coupled to a second semiconductor device different than the first semiconductor device.

* * * * *